United States Patent
Call et al.

(10) Patent No.: US 7,564,236 B1
(45) Date of Patent: Jul. 21, 2009

(54) THERMAL FLY HEIGHT INDUCED SHIELD INSTABILITY SCREENING FOR MAGNETORESISTIVE HEADS

(75) Inventors: David Ernest Call, Folsom, CA (US); Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 12/166,163

(22) Filed: Jul. 1, 2008

(51) Int. Cl.
*G01R 33/09* (2006.01)
*G11B 5/33* (2006.01)
*G11B 5/39* (2006.01)

(52) U.S. Cl. .................. 324/210; 360/313; 360/319

(58) Field of Classification Search ............ 324/207.21, 324/210–213, 249, 252; 360/123.37, 313–318, 360/318.1, 319, 324, 324.1, 324.12, 324.2, 360/325–327
See application file for complete search history.

(56) References Cited

U.S. PATENT DOCUMENTS

| | | | | |
|---|---|---|---|---|
| 5,255,142 A | * | 10/1993 | Williams et al. | 360/125.52 |
| 5,909,340 A | * | 6/1999 | Lairson et al. | 360/237.1 |
| 6,452,204 B1 | * | 9/2002 | Ishiwata et al. | 257/9 |
| 2008/0049351 A1 | * | 2/2008 | Yamanaka et al. | 360/59 |

* cited by examiner

*Primary Examiner*—Bot LeDynh
(74) *Attorney, Agent, or Firm*—Zilka-Kotab, PC

(57) ABSTRACT

A method for testing magnetic heads formed on a wafer to detect the presence of thermal induced popcorn noise resulting from thermal fly height control. The method includes performing a quasi test on a magnetic head, the quasi test being performed over 400 or more cycles of magnetic field application. For additional test accuracy, the write head can be cycled while 400 or more cycles of magnetic field are generated.

20 Claims, 4 Drawing Sheets

THERMAL FLY HEIGHT INDUCED SHIELD INSTABILITY SCREENING FOR MAGNETORESISTIVE HEADS

FIELD OF THE INVENTION

The present invention relates to magnetic heads for data recording, and more particularly to a method for testing magnetic heads during manufacture.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates, air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head has traditionally included a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic transitions in tracks on the moving media, such as in circular tracks on the aforementioned rotating disk.

In recent read head designs, a GMR or TMR sensor has been employed for sensing magnetic fields from the rotating magnetic disk. The sensor includes a nonmagnetic conductive layer, or barrier layer, sandwiched between first and second ferromagnetic layers, referred to as a pinned layer and a free layer. First and second leads are connected to the sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

In order to meet the ever increasing demand for improved data rate and data capacity, researchers have recently been focusing their efforts on the development of perpendicular recording systems. A traditional longitudinal recording system, such as one that incorporates the write head described above, stores data as magnetic bits oriented longitudinally along a track in the plane of the surface of the magnetic disk. This longitudinal data bit is recorded by a fringing field that forms between the pair of magnetic poles separated by a write gap.

A perpendicular recording system, by contrast, records data as magnetizations oriented perpendicular to the plane of the magnetic disk. The magnetic disk has a magnetically soft underlayer covered by a thin magnetically hard top layer. The perpendicular write head has a write pole with a very small cross section and a return pole having a much larger cross section. A strong, highly concentrated magnetic field emits from the write pole in a direction perpendicular to the magnetic disk surface, magnetizing the magnetically hard top layer. The resulting magnetic flux then travels through the soft underlayer, returning to the return pole where it is sufficiently spread out and weak that it will not erase the signal recorded by the write pole when it passes back through the magnetically hard top layer on its way back to the return pole.

SUMMARY OF THE INVENTION

The present invention provides a method for testing for the presence of popcorn noise in a magnetic head. The method includes forming a magnetic head on a wafer the magnetic head including, a read head, a write head and a heater element. The magnetic head is placed into a testing tool, and the heater element is activated. While the heater element is activated, a signal from the read head is monitored while a series of magnetic fields, including 400 or more magnetic field cycles, is generated in the vicinity of the read head. While activating the heater element, monitoring a signal from the read head while generating a series of magnetic fields in a vicinity of the read head, the series of magnetic fields including 400 or more magnetic field cycles.

In order to further improve the accuracy of testing, the write head can be activated during the testing. Because the write head write head generates heat during use (in addition to the heat element) the combined effects of the writer and heater element more closely simulate real world conditions.

Performing the testing over a large number of magnetic field cycles, greatly improves the accuracy of testing when the goal of the test is to detect popcorn noise in the head. The inventors have found that the popcorn noise experienced in a read signal when thermal fly height control if employed, is due to the thermal stresses in the magnetic shields surrounding the read head. Because this popcorn noise is a somewhat random, and sporadic event, it is difficult to detect using standard quasi testing procedures. By performing the test over a much larger number of magnetic cycles, the detected amplitude variation range in a bad head is greatly increased.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Figure 1:
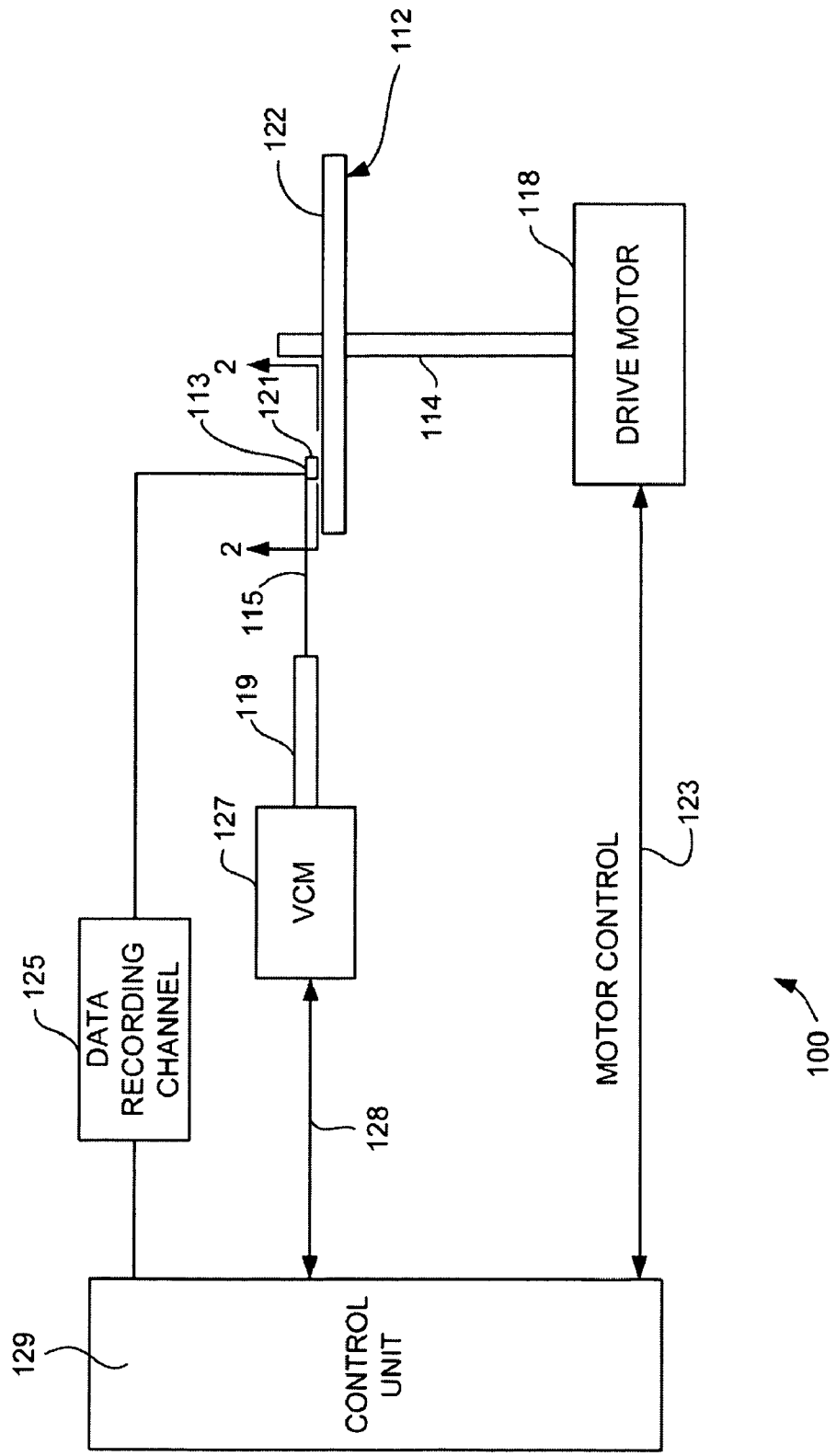
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
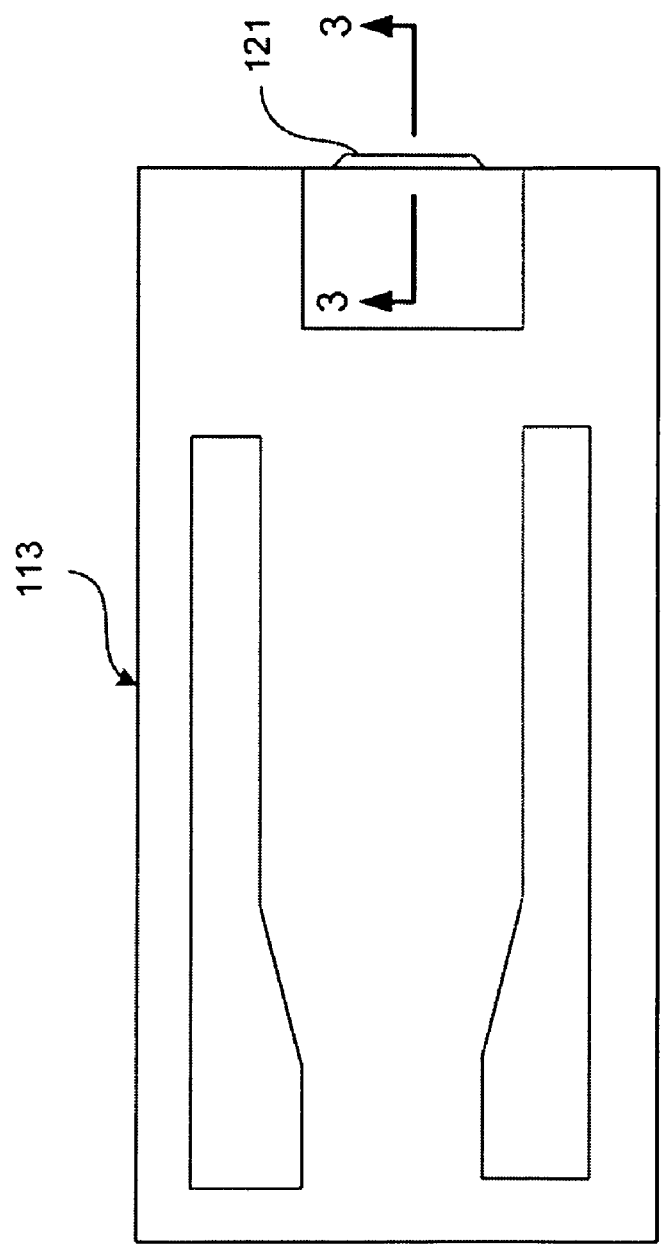
FIG. 2 is an ABS view of a slider, taken from line 2-2 of FIG. 1, illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
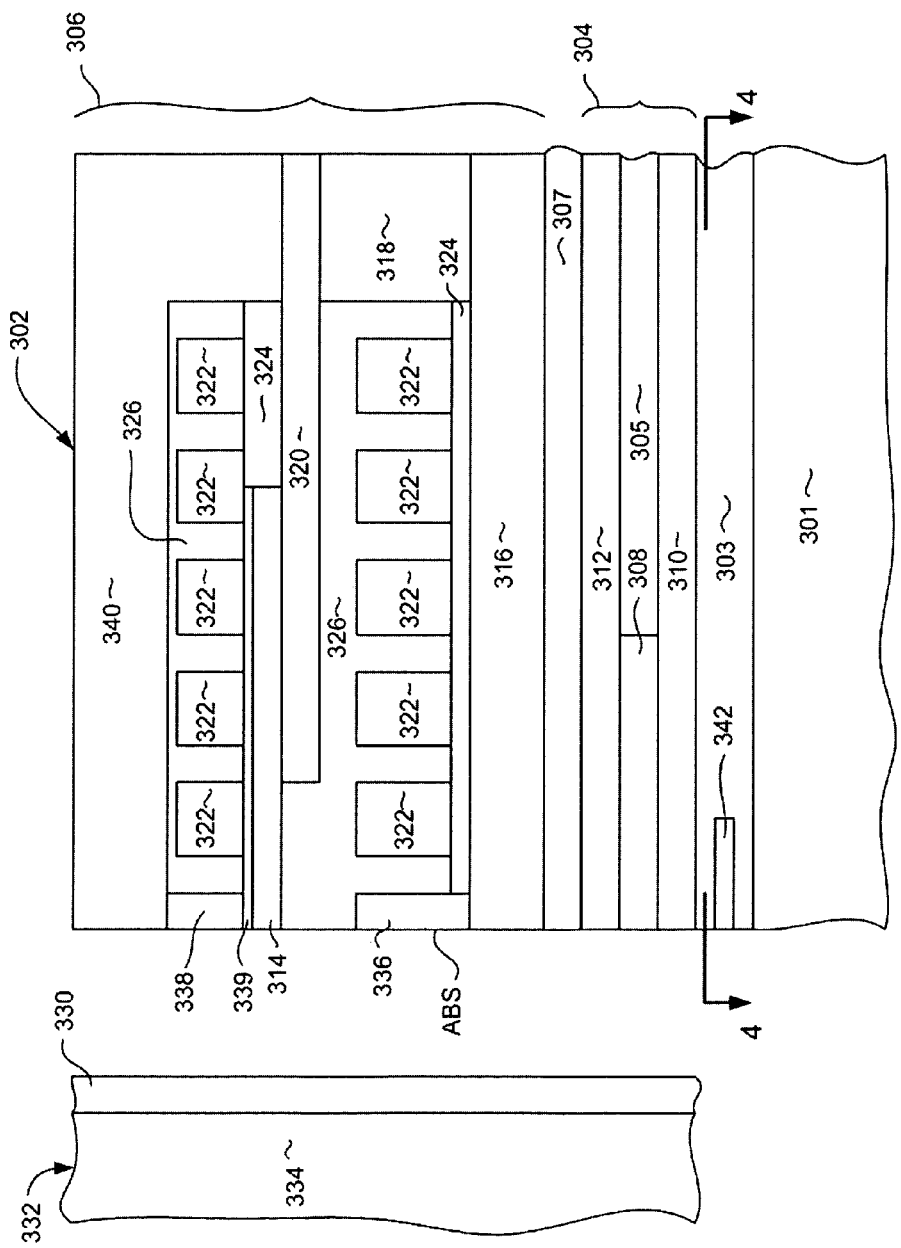
FIG. 3 is a cross sectional view of a magnetic head, taken from line 3-3 of FIG. 2 and rotated 90 degrees counterclockwise, of a magnetic read/write head according to an embodiment of the present invention.

With reference now to FIG. 3, the invention can be embodied in a magnetic head 302. The magnetic head 302 includes a read head 304 and a write head 306. The read head 304 includes a magnetoresistive sensor 308, which can be a giant magnetoresistive sensor (GMR), tunnel junction magnetoresistive sensor (TMR), or some other type of sensor. The magnetoresistive sensor 308 is located between first and second magnetic shields 310, 312. If the sensor 308 is a current perpendicular to plane sensor such as a current perpendicular to plane GMR sensor or a TMR sensor, the magnetic shields 310, 312 can be constructed of an electrically conductive material so that they may function as electrically conductive leads as well as magnetic shields. An insulation layer 307 can also be provided between the read head 304 and write head 306, and can be formed of a material such as alumina.

The write head 306 includes a magnetic write pole 314 and a magnetic return pole 316. The write pole 314 can be formed upon a magnetic shaping layer 320, and a magnetic back gap layer 318 magnetically connects the write pole 314 and shaping layer 320 with the return pole 316 in a region removed from the air bearing surface (ABS). A write coil 322 (shown in cross section in FIG. 3) passes between the write pole and shaping layer 314, 320 and the return pole 316, and may also pass above the write pole 314 and shaping layer 320. The write coil can be a helical coil or can be one or more pancake coils. The write coil 322 can be formed upon an insulation layer 324 and can be embedded in a coil insulation layer 326 such as alumina and or hard baked photoresist.

In operation, when an electrical current flows through the write coil 322. A resulting magnetic field causes a magnetic flux to flow through the return pole 316, back gap 318, shaping layer 320 and write pole 314. This causes a magnetic write field to be emitted from the tip of the write pole 314 toward a magnetic medium 332. The write pole 314 has a cross section at the ABS that is much smaller than the cross section of the return pole 316 at the ABS. Therefore, the magnetic field emitting from the write pole 314 is sufficiently dense and strong that it can write a data bit to a magnetically hard top layer 330 of the magnetic medium 332. The magnetic flux then flows through a magnetically softer under-layer 334, and returns back to the return pole 316, where it is sufficiently spread out and week that it does not erase the data bit recorded by the write head 314. A magnetic pedestal 336 can be provided at the ABS, and attached to the leading return pole 316 to act as a magnetic shield to prevent stray field from the write coil 322 from inadvertently reaching the magnetic media 332.

In order to increase write field gradient, and therefore, increase the speed with which the write head 306 can write data, a trailing, magnetic shield 338 can be provided. The trailing, magnetic shield 338 is separated from the write pole by a non-magnetic write gap 339, and may be connected with the shaping layer 320 and/or back gap 318 by a trailing return pole 340. The trailing shield 338 attracts the magnetic field from the write pole 314, which slightly cants the angle of the magnetic field emitting from the write pole 314. This canting of the write field increases the speed with which write field polarity can be switched by increasing the field gradient. The non-magnetic trailing gap layer 339 can be constructed of a material such as Rh, Ir or Ta.

As mentioned above, the magnetic head 302 should fly as close as close as possible to the magnetic media 330, without actually contacting the media 330 (i.e. "crashing"). The magnetic signal from the media 330 and magnetic write field from the write head 306 decrease exponentially with increasing distance between the media 330 and the head 302. Thermal fly height modulation can be used to control and minimize the spacing between the media 330 and the read and write heads 304, 306. To this end, a heater 342, such as a resistive heater, can be placed within the head 302. As shown in FIG. 3, the heater 342 can be located between the read head 304 and the substrate or slider body 301. However, the heater 342 could be located at some other location within the head 302. In order to decrease the spacing between the media 330 and the read and write heads 304, 306, the heater can heat the read and write heads 304, 306. This heating results in a thermal expansion of the read and write heads 304, 306, which causes the read and write heads 304, 306 to protrude at the ABS. If the read and write heads 304, 306 come to close to the media 330 (so that they risk contacting the media), the amount of thermal protrusion of the read and write heads 304, 306 can be reduced by reducing the heating provided by the heater element 342. The heater element 342 can be formed on or embedded in an insulation layer 303, which can be, for example, alumina.

In read heads such as the read head 304 have experienced excessively large amplitude spike. These spikes have been referred to as "popcorn noise" in the sensor signal. Such amplitude spikes have been found to increase considerably when used a heater such as the heating element 342 is used to provide thermal fly height control. The inventors have found that such noise can be attributed to the thermal stresses in one or more of the shields 310, 312, as a result of heat from the heater element 342. In addition, heat from the write head 306 also contributes to such thermal stresses. When the shields are heated, thermal expansion of the shields 310, 312 causes a mechanical stress in the shields 310, 312. These mechanical stresses in the shields 310, 312 cause magnetic domains within the shields 310, 312 to move around as a result of magnetostriction inherent in the shields themselves. Because the shields 310, 312 are magnetostatically coupled with the sensor, this results in a magnetic field affecting the sensor 308. This magnetic field is sensed by the sensor 308, resulting in the above described "popcorn noise".

In an effort to minimize such thermally induced popcorn noise, the material composition and thickness of the shields can be controlled to some extent to minimize the magnetostriction of the shields 310, 312. However, it is difficult to achieve the necessary composition and thickness uniformity across a wafer or between wafers. Therefore, in order to minimize yield loss, a test is needed to detect when variations in the shield thickness and/or material composition, have lead to an unacceptable level of popcorn noise. This is, however, difficult to detect using standard testing techniques. This is because such "popcorn noise" amplitude spikes tend to be random events that do not occur regularly or continuously.

To this end, the present invention provides a testing method that can detect the presence of popcorn noise early in the manufacturing process even for a head in which the popcorn noise is a somewhat rare and random event. As those skilled in the art will appreciate, a magnetic head 302 is constructed on a wafer with many thousands of such heads being formed on a single wafer. Once the heads 302 have been constructed on the wafer (not shown), the wafer can be placed in a quasi testing tool (also not shown). In the tool, the heater element 342 is activated to simulate the thermal stresses that would occur in actual operation. Then a sense current is applied to the sensor 308, while the sensor is subjected to a magnetic field of a known strength. The amplitude of the signal from the read head 308 is then read to determine if the sensor 308 is functioning properly. If the sensor is functioning properly, then signal will correspond accordingly. If the signal has amplitude spikes greater than that which would be anticipated from the known, applied magnetic field, then the head 308 is experiencing popcorn noise.

However, as mentioned above, such popcorn noise is usually a rare and random event, making it difficult to detect. The known magnetic field applied to the sensor 308 can be applied for a number of cycles. However, manufacturers are very conscious of the time necessary to perform such tests. The time necessary to perform the tests increases manufacturing process time and, therefore, reduces the throughput of the overall manufacturing process. As a result, manufacturers would ordinarily keep the number of magnetic field cycles to a very minimum. For example, a manufacturer might perform such as test using no more than 32 magnetic field cycles before passing the wafer for further processing.

The inventors have found, however, that because the popcorn noise results from stress induced domain movement in the shields 310, 312, and because such popcorn noise occurs as random and isolated amplitude spikes, in order to effectively determine if a head 302 is suffering from popcorn noise, testing must be performed over a much larger number of cycles, while activating the heater element. The inventors have found that testing a head over an extended period of time using 400 or more cycles can effectively detect the presence of popcorn noise in a head. More preferably, testing is performed using 512 cycles.

In one embodiment of the invention, a sense voltage of 100-150 mV or about 125 mV is applied to the sensor 308. A series of magnetic fields is generated in the vicinity of the sensor 308. The series of magnetic fields can have a strength of, for example 300-500 Oe or about 400 Oe, and is preferably performed for 400 or more cycles, or more preferably about 512 cycles. The heater element 342 can be activated by applying power of, for example, 30-50 mW to the heater element 342.

Figure 4:
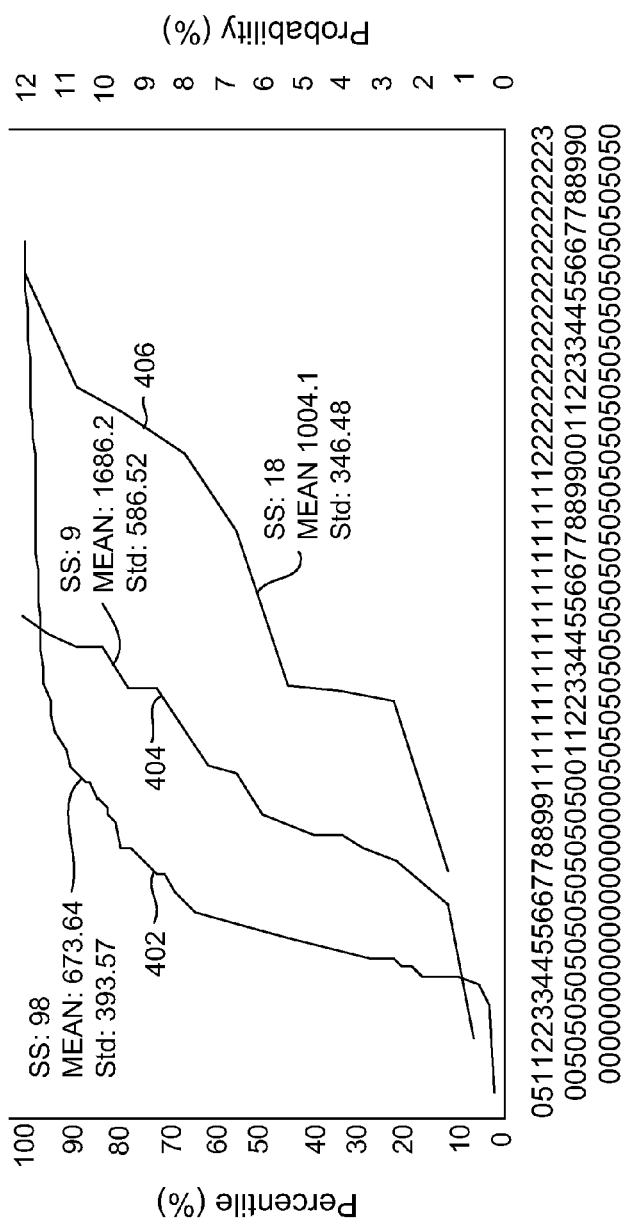
FIG. 4 is a graphical representation of data collected from a test performed according to an embodiment of the invention.

FIG. 4 shows a graph of results of testing performed over 512 cycles. Line 402 shows the results of a control head, such as one taken from a properly functioning disk drive system. Line 404 shows test result for tested heads the pass the quasi test, and line 406 shows test results for heads that failed the quasi test. The amplitude range is the maximum amplitude ranged detected during testing, and as mentioned above, since the testing is performed over a larger number of cycles, the chance for the range to increase due to popcorn noise is greatly increased. As can be seen in FIG. 4, the failed head indicated in line 406 has a much larger amplitude range than either the passed head (line 404) or control head (line 402).

As mentioned above, in addition to the heater element 342 (FIG. 3) affecting the read head 304, the write head 306 can also affect the read head 304. When in operation, the write head 306 generates heat as a result of current flowing through the write coil 322. Therefore, in order to further increase the accuracy of the testing, the testing can be performed while cycling the write head 306. To this end, the wafer is placed in a testing tool (not shown). The heating element is activated, while exposing the sensor 308 to a large number of cycles of magnetic known magnetic fields, and also simultaneously cycling the write head 306 by running a current through the write coil 322. As with the magnetic field cycles, the number of cycles of write head activation should be large, such as 500 cycles or more. (Harry is this true?) This allows the combined effect of the write head 306 and heater element 342 to be tested, which more accurately reflects real world use of the head 302.

In one embodiment, die write head 306 is activated by generating a current of 30-40 mA or about 30 mA. The current can be generated at 30-50 MHz or about 40 MHz. The current can be applied for 10-30 microseconds or about 20 microseconds, with the current being inhibited for 5-15 microseconds or about 10 microseconds between current application. The write head can be activated for 400 or more cycles or about 512 cycles.

Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for testing a magnetic head, comprising:
forming a magnetic head on a wafer the magnetic head including, a read head, a write head and a heater element;
placing the magnetic head into a testing tool;
activating the heater element; and
while activating the heater element, monitoring a signal from the read head while generating a series of magnetic fields in a vicinity of the read head, the series of magnetic fields including 400 or more magnetic field cycles.

2. A method as in claim 1 wherein the series of magnetic fields includes magnetic field having strength of 300-500 Oe.

3. A method as in claim 1 wherein the series of magnetic fields includes magnetic field having strength of 400 Oe.

4. A method as in claim 1 wherein further comprising applying a sense voltage of 100-150 mV to the read head.

5. A method as in claim 1 further comprising applying a sense voltage of about 125 mV to the read head.

6. A method as in claim 1 wherein the series of magnetic fields include about 512 magnetic field cycles.

7. A method as in claim 1 wherein the series of magnetic fields includes magnetic fields having a strength of 300-500 Oe, the method further comprising applying a sense voltage of 100-150 mV.

8. A method as in claim 1 wherein the series of magnetic fields includes magnetic fields having a strength of about 400 Oe, the method further comprising applying a sense voltage of about 125 mV.

9. A method as in claim 1 wherein the read head comprises a magnetoresistive sensor sandwiched between first and second magnetic shields.

10. A method as in claim 1 wherein the read head comprises a magnetoresistive sensor sandwiched between first and second magnetic shields, each of the first and second magnetic shields being constructed of NiFe.

11. A method for testing a magnetic head, comprising:
forming a magnetic head on a wafer the magnetic head including, a read head, a write head and a heater element;
placing the magnetic head into a testing tool;
activating the heater element;
activating the write head and while activating the heater element and write head, monitoring a signal from the read head while generating a series of magnetic fields in a vicinity of the read head, the series of magnetic fields including 400 or more magnetic field cycles.

12. A method as in claim 11, wherein the activating the write head comprises activating the write head through a series of activation cycles.

13. A method as in claim 11, wherein the activating the write head comprises activating the write through 400 or more activation cycles.

14. A method as in claim 11, wherein the activating the write head comprises activating the write head though about 512 activation cycles.

15. A method as in claim 11, wherein the activating the write head comprises activating the write head through a series of 400 or more activation cycles, the activation cycles including generating a current of 20-40 mA through the write head.

16. A method as in claim 11, wherein the activating the write head comprises activating the write head through a series of 400 or more activation cycles, the activation cycles including generating a current of 20-40 mA through the write head, separated 5-15 microseconds of inhibited current.

17. A method as in claim 11, wherein the activating the write head comprises activating the write head through a series of 400 or more activation cycles, the activation cycles including generating a current of 20-40 mA, at 30-50 MHz through the write head, each generation of current through the write head being separated by 5-15 microseconds of inhibited current.

18. A method as in claim 11 wherein the series of magnetic fields includes magnetic field having strength of 300-500 Oe.

19. A method as in claim 1 wherein the series of magnetic fields includes magnetic field having strength of 400 Oe.

20. A method as in claim 11 wherein the series of magnetic fields include about 512 magnetic field cycles.

* * * * *